United States Patent [19]

Fujiwara et al.

[11] Patent Number: 5,356,870
[45] Date of Patent: Oct. 18, 1994

[54] METHOD FOR PROCESSING SUPERCONDUCTING THIN FILMS

[75] Inventors: Shuji Fujiwara; Ryokan Yuasa; Hiroaki Furukawa; Masaaki Nemoto; Masao Nakao, all of Tsukuba, Japan

[73] Assignee: Sanyo Electric Co., Ltd., Osaka, Japan

[21] Appl. No.: 33,898

[22] Filed: Mar. 19, 1993

[30] Foreign Application Priority Data

Mar. 26, 1992 [JP] Japan .................................. 4-68368
Nov. 13, 1992 [JP] Japan .................................. 4-304134

[51] Int. Cl.$^5$ .......................................... B05D 5/00
[52] U.S. Cl. .................................. 505/329; 505/728; 505/410; 156/628; 156/643; 156/644; 156/651; 156/656; 204/192.35; 252/79.1
[58] Field of Search ................ 505/1, 728; 156/651, 156/643, 644, 656, 625, 628; 252/79.1; 204/192.35, 192.32

[56] References Cited

U.S. PATENT DOCUMENTS 4,997,522 3/1991 Shokoohi ..................... 156/656 X
5,227,364 7/1993 Fujiwara et al. ............... 505/728 X

OTHER PUBLICATIONS

Vasquez et al, "Nonaqueous Chemical Depth Profiling of $YBa_2Cu_3O_{7-x}$" Appl. Phys. Lett. 54(11), 13 Mar. 1989.
Tsuge, Hisanao, et al., "Superconducting Lines Fabricated From Epitaxial Y-Ba-Cu-O Films", Jap. Journal of Applied Physics. V.27, No. 11, Nov. 88, pp. L22137–L2239.
B. W. Hussey, et al., "Laser-assistetd etching of $YBa_2Cu_3O_{7-\delta}$" IBM Thomas J. Watson Research Center, Appl. Phys. lett. 54(13), 27 Mar. 1989.
Komuro, Masanori, et al., "Maskless etching of a nanometer structure by focused ion beams", J. Vac. Scl, Technol. B1(4), Oct.–Dec. 1982.
Vasquez, R. P., et al. "Nonaqueous Chemical Etch For $YBa_2Cu_3O_{7-x}$", Appl. Phys. Lett 53(26), pp. 2692–2694, Dec. 26, 1988.
Vasquez, R. P., et al. "Chemical Removal Of Contaminants From Thin Film $BI_4Sr_3Ca_3Cu_4O_{16+x}$ Surfaces", J. Appl. Phys. 67(11), pp. 7141–7144, Jun. 1, 1990.
Werder, D. J., et al., "$Ba_2YCu_3O_{7-\delta}$ Crystal Surface Layers: Orthorhombic Splitting, Dislocations, And Chemical Etching", Elsevier Science Publishers, pp. 411–416, (1988).
Fujiwara, Shuji, et al., "Ion Bombardment Enhanced for Bi-Ca-Sr-Cu-O High-Tc Superconducting Thim Films", Jap. Journal of Appl. Phys. vol. 29, No. 10, Oct. 1990.
Fujiwara, Shuji, et al., "Lower-Submicram Patterning Process for BiSrCaCuO High-Tc Superconducting Thin Films", Jpn. J. Appl. Phys. vol. 32(1993), pp. 685–688, Part1, No. 1B, Jan. 1993.

*Primary Examiner*—Thi Dang
*Attorney, Agent, or Firm*—Spensley Horn Jubas & Lubitz

[57] ABSTRACT

An ion beam is irradiated to an oxide superconducting thin film formed on a substrate to disturb the crystal structure of the superconducting thin film and thus forming a damaged layer. The damaged layer has higher solubility in a halogen solution has a faster etching rate than other portions. Then, the superconducting thin film is etched by using a halogen solution to remove the damaged layer and form a groove at that portion. As a result, a groove of a desired form can be provided efficiently.

15 Claims, 16 Drawing Sheets

METHOD FOR PROCESSING SUPERCONDUCTING THIN FILMS

BACKGROUND OF THE INVENTION

1. Field of the Invention

This invention relates to a method for processing superconducting thin films to form fine grooves, etc., in the films.

2. Description of the Related Art

Josephson junctions made of SNS (superconducting, normal conducting, superconducting) junctions or SIS (superconducting, insulator, superconducting) junctions are used with superconducting devices such as superconducting transistors and superconducting quantum interference devices. The Josephson junction can be easily formed by depositing S, N, and S layers in order, but deposition of such thin films introduces a difficult problem of installation of electrodes to the thin films. Then, fine grooves, etc., are formed in a superconducting thin film for dividing this superconducting thin film into sections, each of which is connected to an electrode. This method provides a planar type where two superconducting thin films are arranged on a single plane, thus greatly facilitating electrode installation, etc.

The ion beam sputter etching method is known as a method of forming fine grooves, etc., in thin films made of oxide superconductors such as the Bi-Sr-Ca-Cu-O systems.

FIG. 1 shows a processing method with a focused ion beam (FIB) as one example of the ion beam sputter etching by which an ion beam 33 having energy of several 10s to several 100s keV and focused to 1–0.1 $\mu$m or so is irradiated to a superconducting thin film 32 on an MgO substrate 31 for sputtering to form a groove 35.

FIG. 2 shows a superconducting thin film processing method as another example of the ion beam sputter etching, (see H. Tsuge et al., Jpn. J. Appl. Phys. Vol. 27 No. 11 November 1988 pp. L2237–L2239, for example.), by which first a desired pattern is formed by means of resist 36 deposited on a superconducting thin film 32 (FIG. 2A), then an ion beam 37 of Ar, etc., is irradiated to the entire thin film 32 for sputtering portions not covered by the resist 36 to form grooves 35 (FIG. 2B), then the resist 36 is removed (FIG. 2C).

On the other hand, the present applicant has previously proposed an ion bombardment enhanced etching method using an alkaline aqueous solution shown in FIG. 3 (U.S. Ser. No. 07/722,009), whereby a damaged layer 34 formed in a superconducting thin film 32 on a substrate 31 by irradiation with an ion beam 33 (FIG. 3A) is removed by alkaline solution treatment to form a groove 35 (FIG. 3B).

However, the conventional processing methods described above introduce the following problems:

In the ion beam sputter etching technique, first, constituent atoms of a superconducting thin film are etched by irradiation with an ion beam, thus causing damaged layers, whose crystal structure is disarranged, to be formed on the sides of the resultant groove. The presence of the damaged layers makes the effective gap width wider than the width of the groove. Although the crystal structure of the damaged layer can be restored to some degree by proper annealing, the groove form changes, thus particularly when fine grooves are formed, there is a possibility that a disadvantage such as the grooves being in contact with each other will occur.

On the other hand, in the ion bombardment enhanced etching technique using an alkaline aqueous solution, first, a large ion dose of $4.6 \times 10^{16}$ to $2.6 \times 10^{17}$ ions/cm$^2$ is required when 200-keV Si$^{++}$ ions are used, for example.

Second, a damaged layer formed by irradiation with ions is removed to some degree by alkaline solution treatment, but is insufficiently removed. Thus, when a fine groove is to be formed, the damaged layers will make the effective gap width wider than the width of the groove. Although the crystal structure of the damaged layer can be restored to some degree by proper annealing, the groove form changes, thus particularly when fine grooves are formed, there is a possibility that a disadvantage such as the grooves being in contact with each other will occur.

Third, when a superconducting thin film is treated by using an alkaline aqueous solution, although the superconducting transition temperature does not change, the electric resistance at room temperature gradually increases with the treatment time as shown in FIG. 4; the alkali treatment has some effect on the superconducting thin film.

Fourth, when a superconducting thin film is treated by using an alkaline aqueous solution, an exposed substrate is exposed to the alkaline aqueous solution and pure water for washing after the treatment; some of the MgO used as the substrate is dissolved in the water.

SUMMARY OF THE INVENTION

Accordingly, it is an object of the invention to provide a method of processing superconducting thin films by which the superconducting thin film formed on a substrate can be divided efficiently.

To these ends, according to one embodiment of the invention, there is provided a method of processing a superconducting thin film formed on a substrate comprising the steps of:

irradiating an ion beam to a superconducting thin film made of oxide superconducting material to form a damaged layer; and removing the damaged layer by using a halogen solution.

An ion beam is irradiated to a superconducting thin film for ion-implanting into the thin film, thereby forming a damaged layer whose crystal structure is disarranged on the superconducting thin film. The damaged layer has higher solubility for a halogen solution compared with a portion whose crystal structure is not disarranged. Then, the superconducting thin film containing the damaged layer can be dipped in a halogen solution for selectively dissolving and removing the damaged layer to form a desired groove.

The fact that the damaged layer has higher solubility for a halogen solution is also substantiated by a report, in magazine Physica C 160 (1988) pp. 411–416, which indicates that dislocation portions or defective portions of a Ba$_2$YCu$_3$O$_{7-\delta}$ superconducting thin film are faster in etching rate than any other portion.

Since the damaged layer is removed through the halogen solution, a groove can be obtained with the effective gap width intact. Thus, the first problem in the ion beam sputter etching method described above, that is, the problem of the presence of a damaged layer causing the effective gap width to be made wider than the groove width can be overcome.

The method of the invention does not introduce the four problems in the ion bombardment enhanced etching method using an alkaline solution.

First, processing requires about a 1000 times smaller ion dose compared with the alkali treatment method, thus the problem of the alkali treatment method requiring a large ion dose is eliminated.

Second, damaged layers are sufficiently removed compared with the alkali treatment method, thus they do not remain.

Third, alkali treatment has no effect on the superconducting thin films.

Fourth, MgO used as the substrate material is not dissolved in water.

Particularly, an ethanol solution of bromine is preferable as a halogen solution.

Bi-Sr-Ca-Cu-O and Y-Ba-Cu-O superconducting thin films are adopted as superconducting thin films.

The damaged layer forming step includes forming on the superconducting thin film a resist layer having a hole in a portion in which the damaged layer is to be formed and then irradiating ions to the entire resist layer.

This can simplify the ion irradiation step. An FIB or the like must be used to limit ion implantation to a predetermined area only. However, a resist can be used for easy patterning by photo lithography and ions need only to be irradiated to a full surface, facilitating the processing steps.

According to another embodiment of the invention, there is provided a method of processing a superconducting thin film formed on a substrate comprising the steps of:

irradiating an ion beam to a superconducting thin film made of oxide superconducting material for sputtering to form a groove; and removing a damaged layer formed around the groove by sputtering by using a halogen solution.

After a desired groove is formed by sputtering, the damaged layer formed around the groove is removed, thereby preventing a thin film which has lost its superconducting characteristics from remaining around the groove. If a normal conductor is buried in the formed groove to make an SNS (superconducting, normal conducting, superconducting) Josephson junction, a good junction can be provided.

In this case, an ethanol solution of bromine is also preferable as the etching liquid for removing the damaged layer.

DESCRIPTION OF THE PREFERRED EMBODIMENTS

First Embodiment

Figure 1:
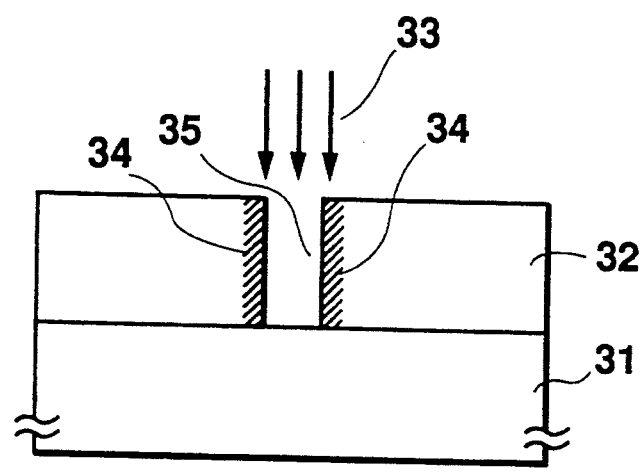
FIG. 1 is a sectional view of a superconducting thin film showing a conventional processing method thereof.
Figure 2A:
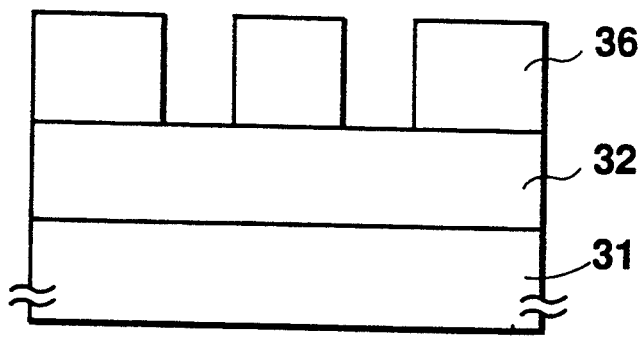
FIGS. 2A to 2C are sectional views of a superconducting thin film showing, step by step, a conventional processing method thereof (2A shows the resist formation state, 2B the groove formation state by sputtering, and 2C the resist removal state)
Figure 2B:
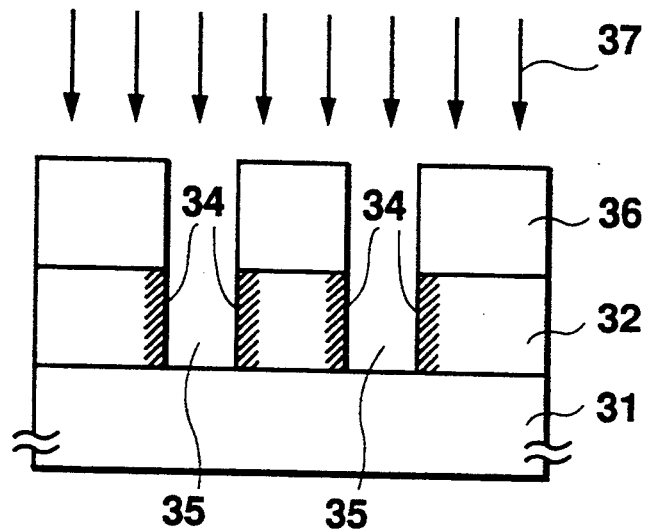
Figure 2C:
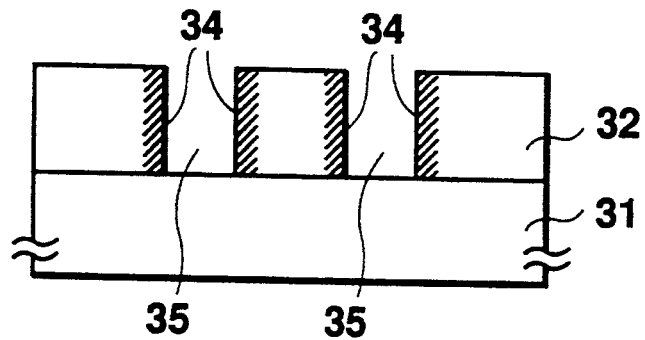
Figure 3A:
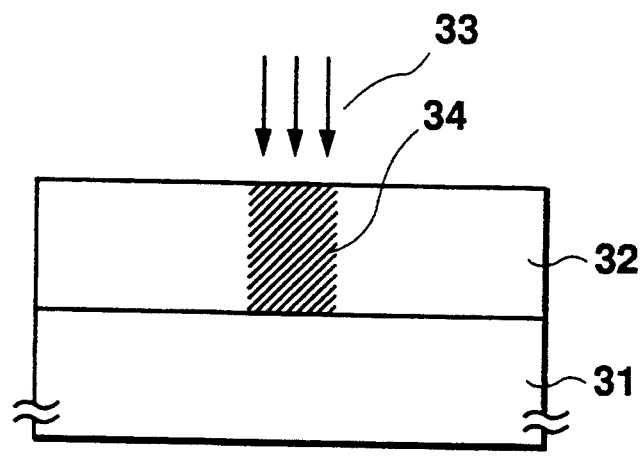
FIGS. 3A and 3B are sectional views of a superconducting thin film showing, step by step, a conventional processing method thereof (3A shows the damaged layer formation state and 3B the damaged layer removal state by means of an alkaline solution)
Figure 3B:
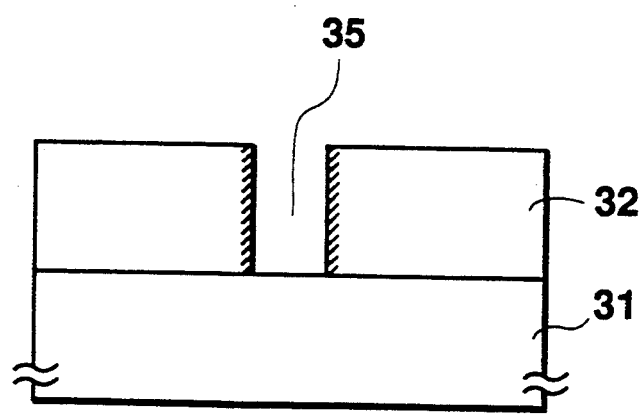
Figure 4:
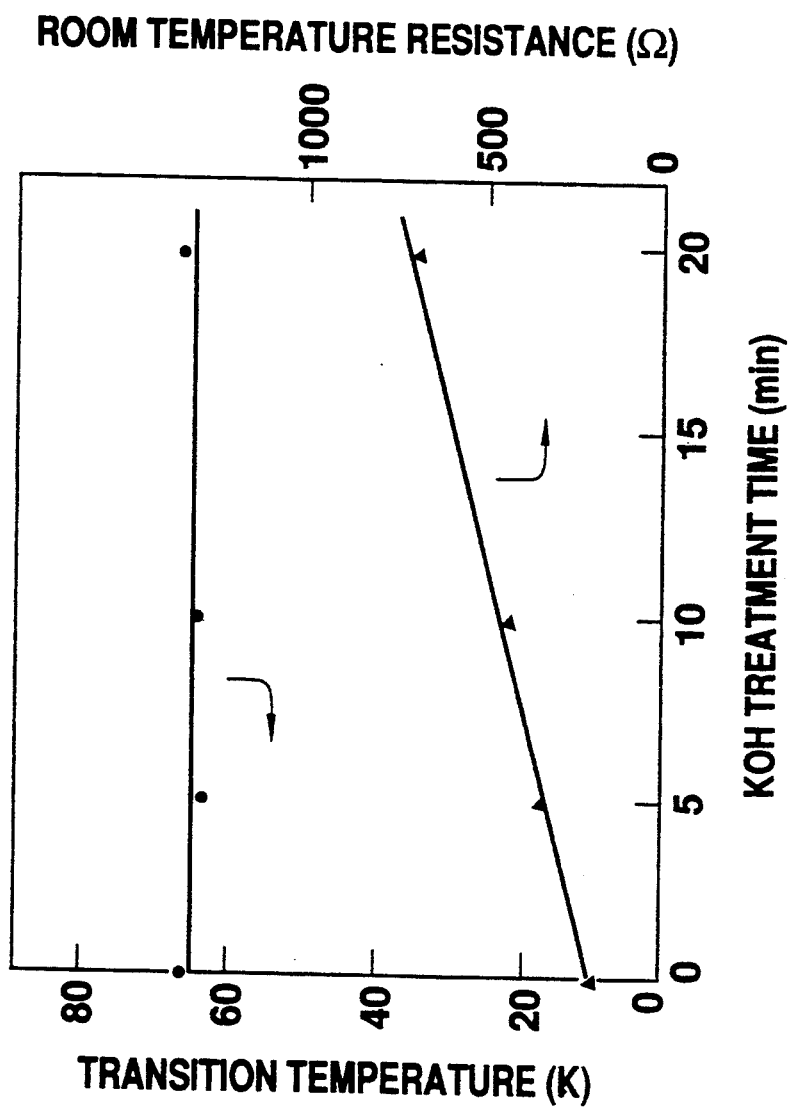
FIG. 4 is a graph showing the relationships between treatment time, superconducting transition temperature, and electric resistance in alkaline aqueous solution treatment of a superconducting thin film.
Figure 5A:
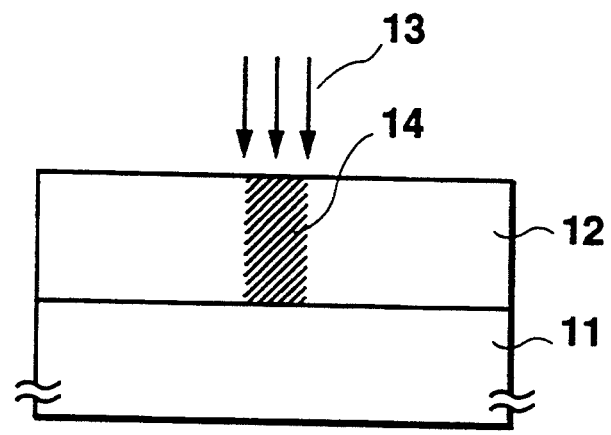
FIGS. 5A and 5B are sectional views of a superconducting thin film showing, step by step, a processing method thereof according to a first embodiment of the invention (5A shows the damaged layer formation state and 5B the state after removal of the damaged layer)
Figure 5B:
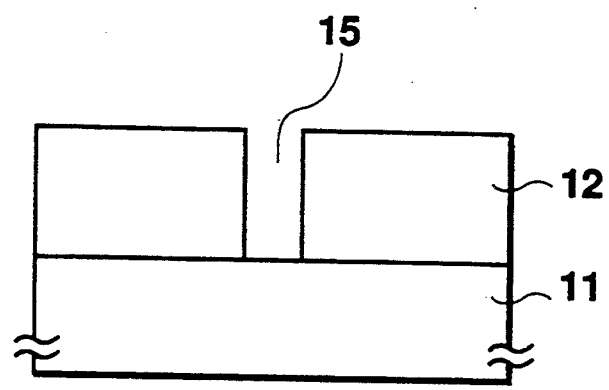

FIG. 5 shows a first embodiment: FIG. 5A is a schematic sectional view of a superconducting thin film showing the state in which a damaged layer is formed by irradiation with a focused ion beam (FIB) and FIG. 5B is a schematic sectional view of the superconducting thin film showing the state in which the damaged layer is removed. Although the superconducting thin film is actually only about 1/1000th the thickness, of the substrate, the superconducting thin film is drawn thick by making both scales different in the figure for easy understanding.

In the first embodiment, MgO, SrTiO$_3$, YSZ (zirconia stabilized with yttria), Al$_2$O$_3$, LaAlO$_3$, LaGaO$_3$, NdGaO$_3$, or the like can be used as an insulator substrate 11, but a (100) MgO substrate was used in the embodiment.

Figure 6:
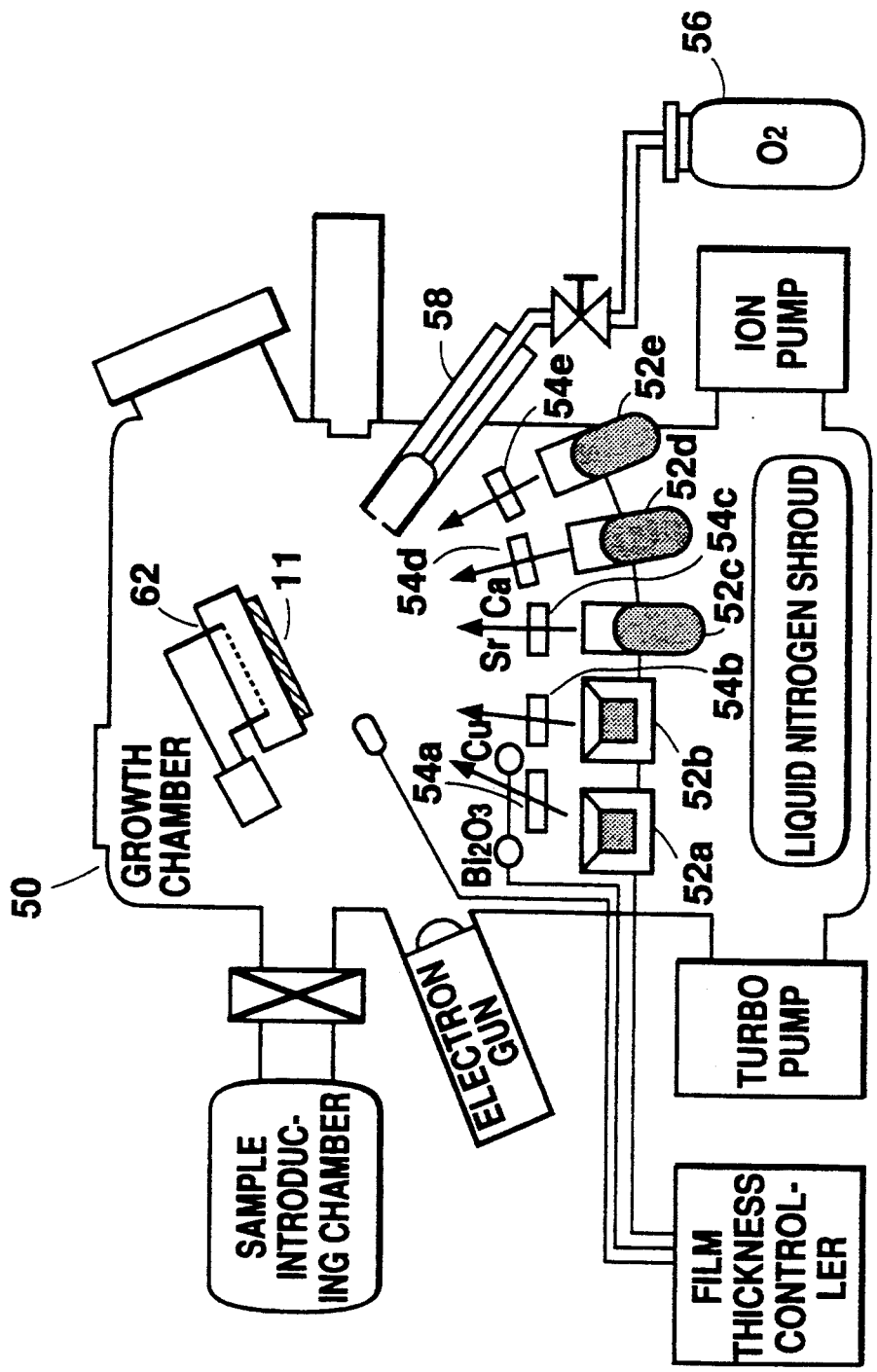
FIG. 6 shows the structure of a molecular beam epitaxy system used with embodiments of the invention.

FIG. 6 is a schematic drawing of a thin film producing system using a molecular beam epitaxy system, wherein a vacuum chamber 50 has two electron beam type evaporation sources 52a and 52b and three crucible type evaporation sources 52c–52e using resistance heating. Materials such as bismuth oxide Bi$_2$O$_3$, strontium Sr, calcium Ca, and copper Cu are emitted separately as atoms or molecules from the evaporation sources 52a–52e. Their emission is controlled by means of shutters 54a–54e corresponding to the evaporation sources. Further, the vacuum chamber is equipped with a radical beam source 58 connected to an oxygen cylinder 56; molecular oxygen from the oxygen cylinder 56 is supplied as atomic oxygen O* which is then irradiated toward the substrate 11. The substrate 11 is fixed on a substrate holder 62 located at a position opposite to the evaporation sources 52 in the vacuum chamber 50 so that a desired thin film can be formed on the substrate 11.

First, Bi$_2$O$_3$, Sr, Ca, Cu, and atomic oxygen O* were irradiated onto the substrate 11 to form a Bi-Sr-Ca-Cu-O superconducting thin film. The substrate temperatures are 650° C.–750° C. The shutters 54a–54e were controlled for opening in sequence to deposit Bi$_2$O$_3$, Sr, Ca, and Cu on the MgO substrate 11 in such order as Bi, Sr, Cu, Ca, Cu, Sr, Bi-Bi, Sr, Cu, Ca, Cu, Sr, Bi- . . . . Their approximate evaporation amounts as the deposit thickness and supply amounts are as follows: 0.125 nm/s for Bi$_2$O$_3$, 0.220 nm/s for Sr, 0.220 nm/s for Ca, 0.040 nm/s for Cu, and $1 \times 10^{16}$ species/s, cm$^2$ for O*. The approximate open time of each of the evaporation sources (shutter open time) is as follows: 3.20 s for Bi$_2$O$_3$, 4.02 s for St, 3.85 s for Ca, and 2.90 s for Cu.

Although Bi$_2$O$_3$, Sr, Ca, Cu, and atomic oxygen O* were irradiated at the same time in the embodiment, atomic oxygen O* may be irradiated after each deposition of Bi, Sr, Cu, Ca, Cu, Sr, Bi. The thickness of the Bi-Sr-Ca-Cu-O superconducting thin film was 150 nm in the embodiment, but may also range from 50 to 200 nm.

As shown in FIG. 5A, an ion beam is irradiated to a superconducting thin film 12 thus obtained to form a damaged layer 14. In the embodiment, the damaged layer 14 was formed by irradiation with a focused ion beam (FIB) with Si$^{++}$ of energy 200 keV. After the damaged layer 14 was formed in such a manner, a bromine ethanol solution was used as an etching liquid and the superconducting thin film 12 was dipped for etching, then washed with ethanol. As a result, a groove 15 shown in FIG. 5B was able to be formed.

Although Si$^{++}$ ions of acceleration energy 200 keV were irradiated to the superconducting thin film in the embodiment, substantially the same results as in the first embodiment were obtained by irradiating 200-keV Be$^{++}$ ions or 200-keV Au$^{++}$ ions to the superconducting thin film and by treatment in a bromine solution. Likewise, other ions may also be used. Table 1 lists the ion doses to enable etching when 200-keV Au$^{++}$, Si$^{++}$, and Be$^{++}$ ions are used Table 1 lists the ion doses to enable etching whose depth is 500 nm when treatment is given at 6° C. for 5 seconds in a bromine ethanol solution of 0.06 vol %.

TABLE 1

| Ion irradiation energy | Ion dose |
| --- | --- |
| 200 keV Au$^{++}$ | $1.8 \times 10^{12}$ ions/cm$^2$ |
| 200 keV Si$^{++}$ | $1.5 \times 10^{13}$ ions/cm$^2$ |
| 200 keV Be$^{++}$ | $6.2 \times 10^{14}$ ions/cm$^2$ |

Next, Table 2 lists the nuclear collision energy with respect to the critical ion irradiation to enable etching.

TABLE 2

| | Ion dose (ions/cm$^2$) | Nuclear collision energy (eV nm$^{-1}$ ion$^{-1}$) | Nuclear collision energy (eV nm$^{-3}$) |
| --- | --- | --- | --- |
| 200 keV Au$^{++}$ | $1.8 \times 10^{12}$ | 2110 | 38 |
| 200 keV Si$^{++}$ | $1.5 \times 10^{13}$ | 150 | 23 |
| 200 keV Be$^{++}$ | $6.2 \times 10^{14}$ | 8.35 | 52 |

As can be understood from the table, damaged layers that can be etched can be provided at substantially similar nuclear collision energy. That is, if the nuclear collision energy can take a similar value to any value listed in Table 2, damaged layers that can be etched can be provided by irradiation with any kinds of ions. The nuclear collision energy is calculated by known simulation using the Monte Carlo method.

Other experiments reveal that a superconducting thin film to which nuclear collision energy having a similar value to the value in Table 2 is given loses its superconducting characteristic. Therefore, the portion of the superconducting thin film losing its superconducting characteristic through the use of the bromine solution is removed. In contrast, the portion not removed by the bromine solution treatment is a portion in which the superconducting characteristic is maintained, that is, the superconducting thin film after the bromine solution treatment does not contain the damaged layer.

In the embodiment, ions are implanted into the superconducting thin film by using an FIB. On the other hand, sputter etching with an FIB as described above is known as sputter etching of a superconducting thin film with an FIB using 80-keV Au$^+$, etc. (See "5th International Workshop on Future Electron Devices" Jun. 2–4, 1988, Miyagi Zao pp. 245–249, for example.) However, the dose ranges from $1 \times 10^{17}$ to $10^{18}$ ions/cm$^2$, and is greater by $10^5$ or so as compared with the embodiment. Therefore, it is understood that the technology of the damaged layer formation in the embodiment is entirely different from sputter etching.

Next, Table 3 lists the results of experiments where the concentration of a bromine solution used as etching liquid and the treatment time were variously changed in the first embodiment. 200-keV Si$^{++}$ was used for ions.

TABLE 3

| Sample No. | Bromine Concentration (vol %) | Temperature (°C.) | Treatment Time (s) | Results |
| --- | --- | --- | --- | --- |
| 1 | 0.006 | 20 | 10 | Insufficient removal of damaged layer |
| 2 | 0.006 | 20 | 15 | Portions irradiated with no ions are also fairly etched |
| 3 | 0.02 | 6 | 3 | Insufficient removal of damaged layer |
| 4 | 0.02 | 6 | 7 | ○ |

TABLE 3-continued

| Sample No. | Bromine Concentration (vol %) | Temperature (°C.) | Treatment Time (s) | Results |
| --- | --- | --- | --- | --- |
| 5 | 0.02 | 6 | 15 | Portions irradiated with no ions are also fairly etched |
| 6 | 0.06 | 6 | 3 | ○ |
| 7 | 0.06 | 6 | 5 | ○ |
| 8 | 0.06 | 6 | 7 | Portions irradiated with no ions are also fairly etched |

In this table, the circle denotes that the areas irradiated with ion dose listed in Table 1 or more were etched and that the areas irradiated with ion dose less than listed in Table 1 and those irradiated with no ions were hardly etched. That is, the desirable conditions in the invention are indicated by the circles. The desirable conditions are not limited to those indicated by the circles and may be close to those indicated by the circles.

Substantially the same results as described above were obtained by making experiments with a bromine methanol solution, a bromine aqueous solution, a chlorine ethanol solution, a chlorine methanol solution, and a chlorine aqueous solution instead of a bromine ethanol solution.

Next, given is a measurement example of the electrical characteristics of a Bi-Sr-Ca-Cu-O superconducting thin film processed by the method of the invention.

Figure 7A:
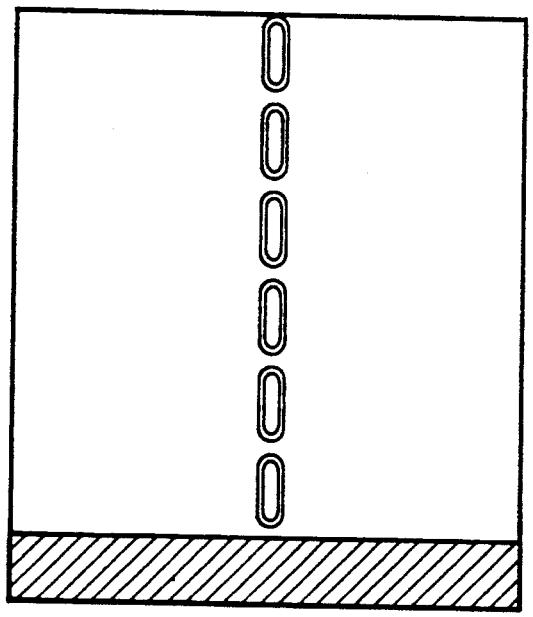
FIG. 7A is a drawing showing the form of a superconducting thin film with grooves formed according to embodiment of the invention and FIG. 7B is a schematic drawing of current-voltage characteristic measurement.
Figure 7B:
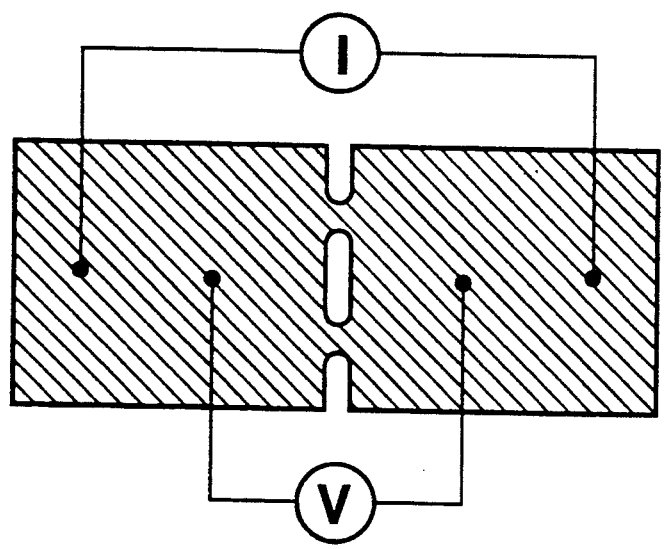

FIG. 7 shows the measurement method of the electrical characteristics of a superconducting thin film: FIG. 7A shows the form of grooves formed like a broken line for dividing a superconducting thin film by the method of the embodiment and FIG. 7B shows a schematic drawing to measure the current-voltage characteristics of the portion between the grooves.

Figure 8:
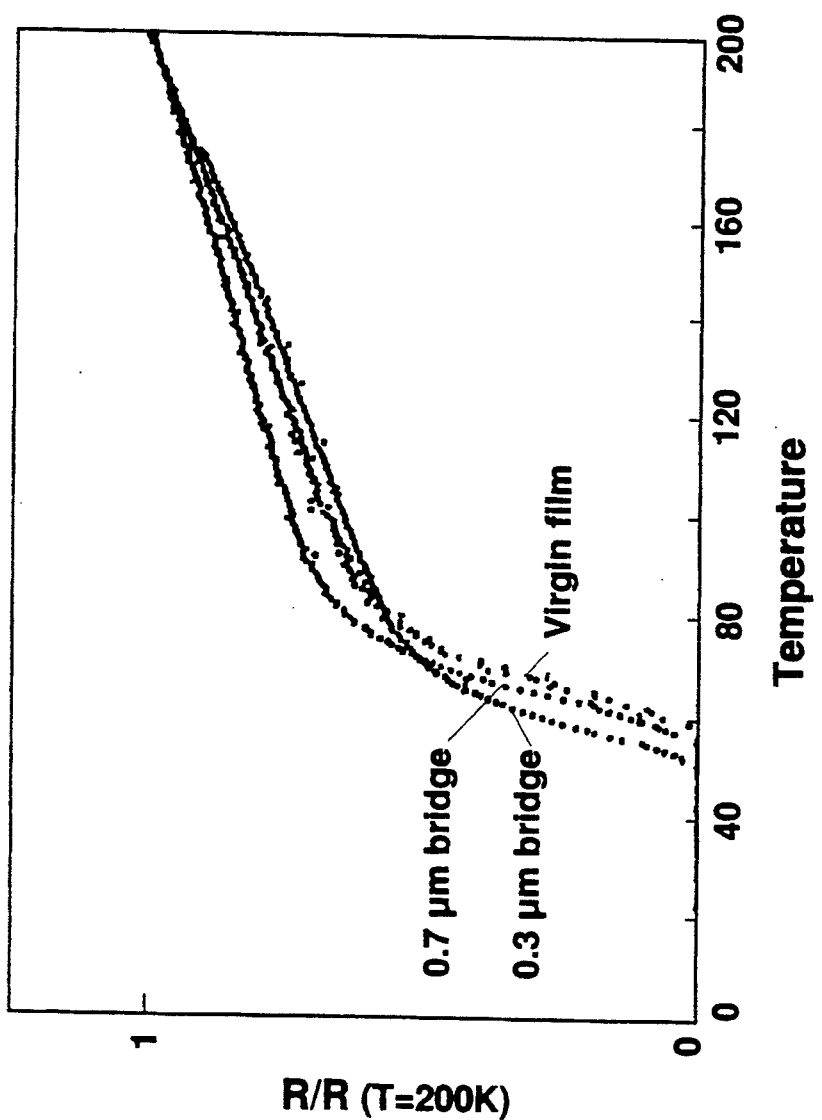
FIG. 8 is a graph showing the resistance-temperature dependency characteristics of a superconducting thin film processed by the invention.

As a result, temperature dependency of resistance substantially the same as that before processing (that of virgin film) was obtained regardless of whether the remaining portion is 0.7 μm or 0.3 μm in width, as shown in FIG. 8. Particularly, it is understood that the critical temperature at which superconducting occurs does not deteriorate very much. When the critical current density was measured at 18K, a value of $10^5$ A/cm$^2$ or more is always indicated from which it is understood that the electrical characteristics of a thin film scarcely deteriorate and that extremely fine processing can be applied by the invention.

Figure 9A:
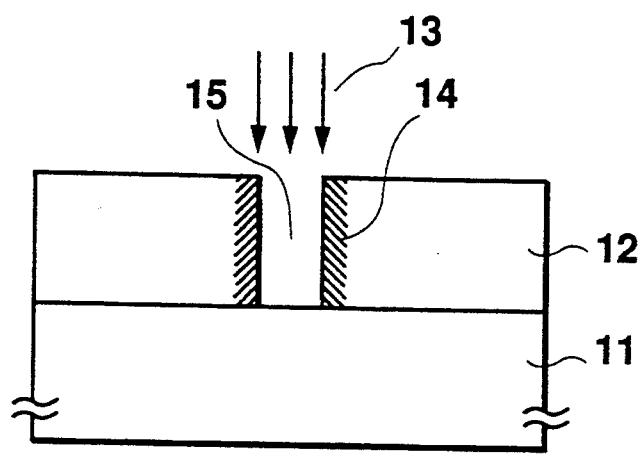
FIGS. 9A and 9B are sectional views of a superconducting thin film showing, step by step, another processing method thereof according to the first embodiment of the invention (9A shows the damaged layer formation state and 9B the state after removal of the damaged layer)
Figure 9B:
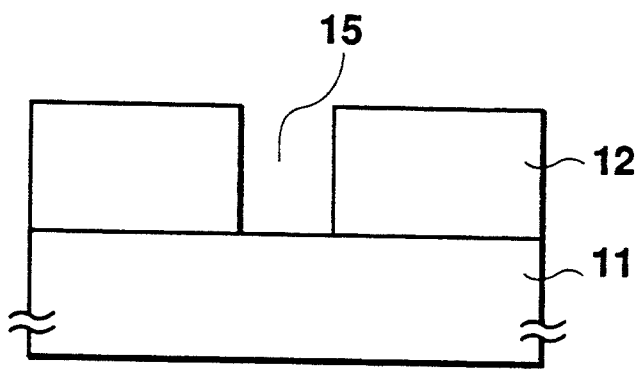
Figure 10A:
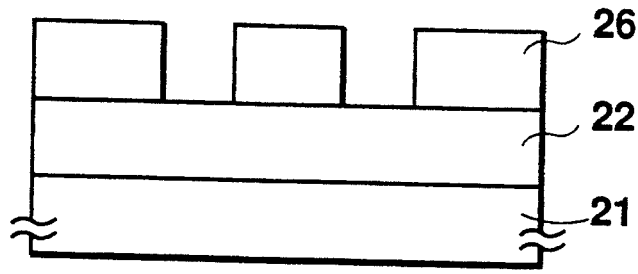
FIGS. 10A to 10D are sectional views of a superconducting thin film showing, step by step, a processing method thereof according to a second embodiment of the invention (10A shows the resist formation state; 10B the damaged layer formation state, 10C the damaged layer removal state, and the 10D the resist removal state)
Figure 10B:
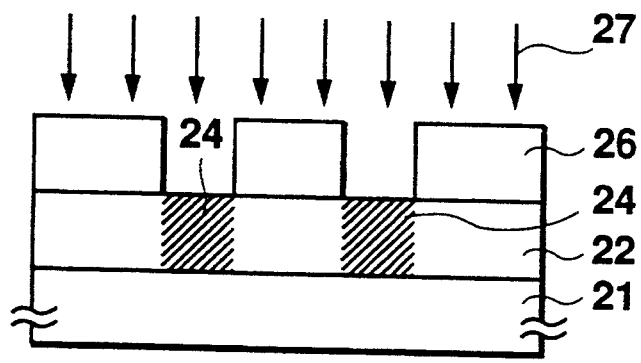
Figure 10C:
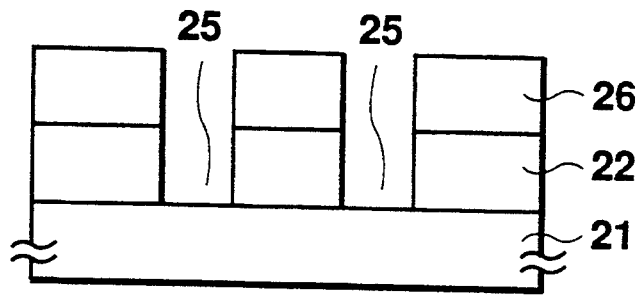
Figure 10D:
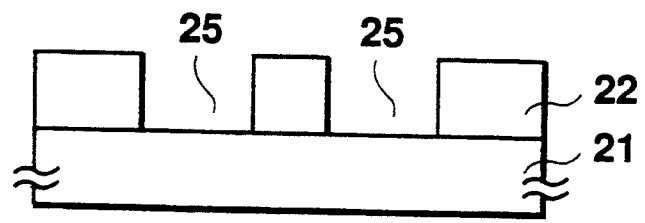
Figure 11A:
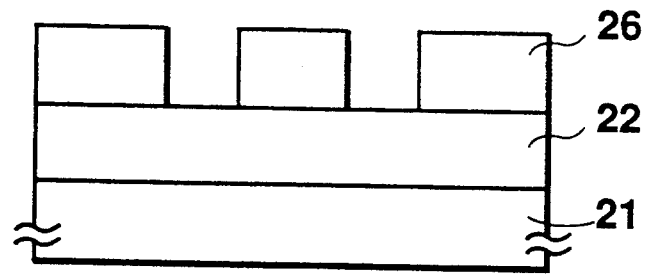
FIGS. 11A to 11D are sectional views of a superconducting thin film showing, step by step, another processing method thereof according to the second embodiment of the invention (11A shows the resist formation state; lib the damaged layer formation state, 11C the damaged layer removal state, and the 11D the resist removal state)
Figure 11B:
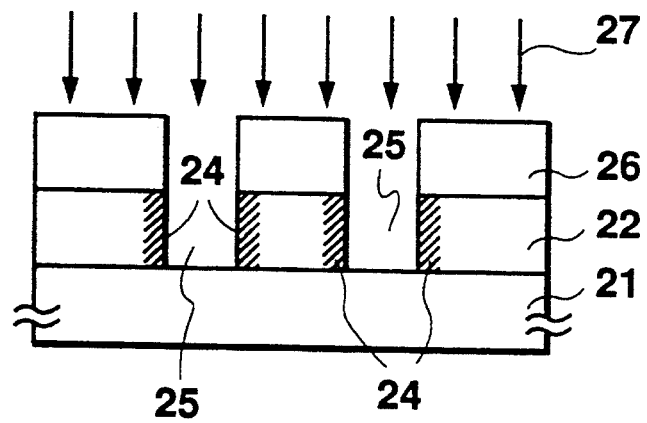
Figure 11C:
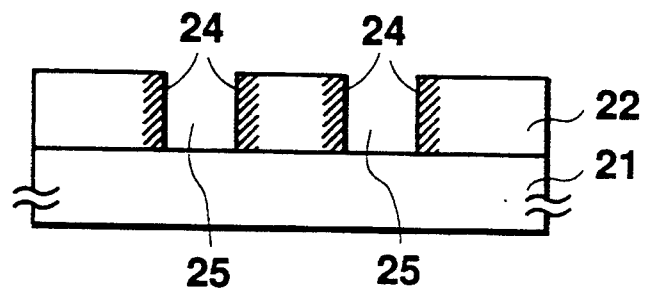
Figure 11D:
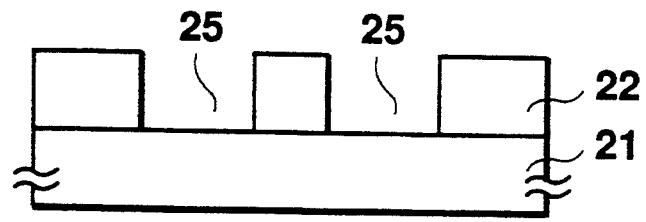

Although ion beam sputtering is not performed in the embodiment, the method shown in FIG. 9 can also be used: First, an ion beam 13 is irradiated to a superconducting thin film 12 for sputtering to form groove 15. (FIG. 9A) Next, a damaged layer 14 formed around the groove 15 is removed by bromine solution treatment. (FIG. 9B)

Although an FIB may be used for irradiation with ions, it is proper to use ions whose energy is smaller than and whose weight is heavier than the FIB of 200-keV Si++ described above. For example, it is desirable to use FIBs of several 10 to several 100 keV Au+, Ga+, Bi+, etc. The ion dose ranges from $10^{16}$ to $10^{18}$ ions/cm$^2$ although it varies depending on the processing depth.

Thus, unlike the method with no sputtering, the processing depth is not limited by ion energy and any desired processing depth can be determined by the sputter etching time. As compared with the method with no sputtering, the method with sputtering needs low ion energy, thus the structures of an acceleration power supply, etc., of an ion irradiation apparatus can be simplified.

Second Embodiment

FIG. 10 shows a second embodiment: FIG. 10A is a schematic sectional view of a superconducting thin film where a resist pattern 26 is formed on superconducting thin film 22; FIG. 10B is a schematic sectional view of the superconducting thin film showing the state in which a damaged layer 24 is formed by irradiation with an ion beam; FIG. 10C is a schematic sectional view of the superconducting thin film showing the state in which the damaged layer 24 is removed; and FIG. 10D is a schematic sectional view of the superconducting thin film showing the state in which the resist pattern 26 is removed.

An insulator substrate 21 (MgO substrate) and the superconducting thin film 22 in the second embodiment are the same as those in the first embodiment, but the resist pattern 26 is formed on the superconducting thin film 22 in the second embodiment. From above the resist pattern 26, an ion beam 27 of Ar+, Ne+, Si++, etc., is irradiated to the full surface of the film to form the damaged layer 24. (FIG. 10B) In the embodiment, the ion beam 27 of Si++, etc. was used at an energy of 200 keV.

Then, the superconducting thin film 22 formed with the damaged layer 24 was dipped in an etching liquid to form grooves 25. (FIG. 10C) Next, the resist pattern 26 was removed to form the superconducting thin film 22 having the grooves 25. (FIG. 10D) The etching conditions in the second embodiment were the same as those in the first embodiment. The steps in FIGS. 10C and 10D may also be reversed in sequential order.

Although ion beam sputtering is not performed in the second embodiment, the method shown in FIG. 11 can also be used: First, a resist pattern 26 is formed on a superconducting thin film 22 (FIG. 11A), then an ion beam 27 is irradiated to the film for sputtering to form an groove 25 (FIG. 11B). Next, the resist pattern 26 is removed (FIG. 11C). Last, the damaged layer 24 formed around the groove 25 is removed by bromine solution treatment (FIG. 11D). The steps in FIGS. 11C and 11D may also be replaced with each other in order.

Although an FIB may also be used for irradiation with ions, an ion beam of Ar+, Ne+, etc., can be irradiated to the entire sample. It is proper to use energy of several 10 eV to several 100 eV. The ion dose ranges from $10^{16}$ to $10^{18}$ ions/cm$^2$ although it varies depending on the processing depth.

Thus, unlike the method with no sputtering, the processing depth is not limited by ion energy and any desired processing depth can be determined by the sputter etching time. As compared with the method with no sputtering, the method with sputtering needs low ion energy, thus the structures of an acceleration power supply, etc., of an ion irradiation apparatus is simplified.

As in the first embodiment, division of a superconducting thin film by effective groove formation can also be accomplished in the second embodiment.

For example, a normal conductor can be buried in a groove provided by the second embodiment to form a good SNS (superconducting, normal conducting, and superconducting) Josephson junction for producing a superconducting device.

Third Embodiment

Described below is a third embodiment using a Y-Ba-Cu-O sytem thin film as a superconducting thin film. The third embodiment is as shown in FIGS. 5A (in the state in which a damaged layer is formed by irradiation with a focus ion beam (FIB)) and 5B (in the state in which the damaged layer is removed) except for the superconducting thin film 12.

In the second embodiment, MgO, SrTiO$_3$, YSZ (zirconia stabilized with yttria), Al$_2$O$_3$, LaAlO$_3$, LaGaO$_3$, NdGaO$_3$, or the like can be used as an insulator substrate 11, but a (100) MgO substrate was used in the embodiment.

Figure 12:
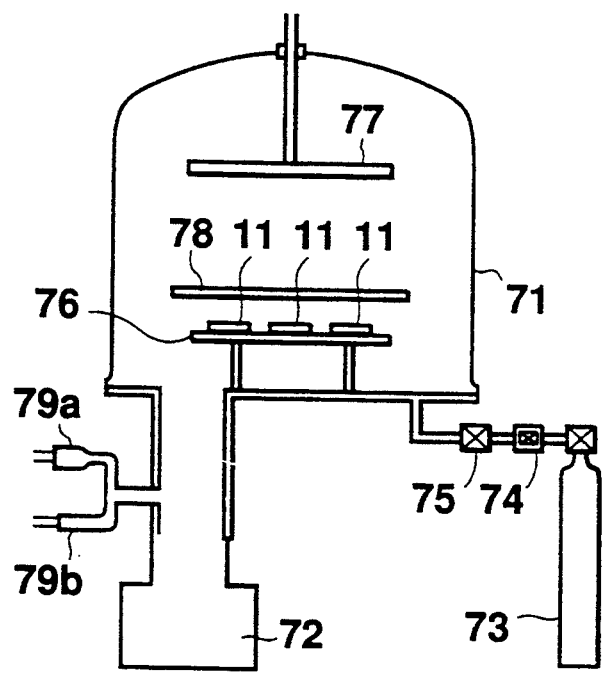
FIG. 12 is a drawing showing the structure of a sputtering system used with a third embodiment of the invention.

FIG. 12 shows a sputtering system for forming superconducting thin films, wherein numeral 71 is a belljar of the sputtering system with which an exhaust system 72 is linked; numeral 73 is an argon cylinder and oxygen cylinder for supplying argon gas and oxygen gas (discharge gas) to the belljar 71 and is connected via variable leak valves 74 and stop valves 75 to the belljar 71; and numerals 76 and 77 are opposite electrodes located opposite to each other via a movable shutter 78 in the belljar 71. The anode 76 is grounded, and MgO substrates 11 are placed on the anode for depositing superconducting thin films on their surfaces.

On the other hand, the cathode 77 is made of a target material consisting of a sinter, and a high negative voltage is applied to the cathode 77. The composition ratio of the target is Y$_1$Ba$_{1.3}$Cu$_{2.5}$O$_8$. Numerals 79a and 79b are high and low vacuum gauges respectively. Argon gas and oxygen gas were supplied from the argon gas cylinder and oxygen gas cylinder 73 to the belljar 71 at pressures of 10 mTorr and 20 mTorr respectively, and at the same time, sputtering was performed with a sputter output level of 100 W to deposit Y-Ba-Cu-O thin films on the substrates 11. The substrate temperature was 650° C. during deposition.

The thickness of the Y-Ba-Cu-O thin film was 100 nm in the embodiment, but may range from 50 to 200 nm.

As shown in FIG. 5A, an ion beam is irradiated to the superconducting thin film 12 thus obtained to form a damaged layer 14. In the embodiment, the damaged layer 14 was formed by irradiation with a focused ion beam (FIB) with Si$^{++}$ of energy 200 keV. After the damaged layer 14 was formed in such a manner, a bromine ethanol solution was used as etching liquid and the superconducting thin film 12 was dipped for etching, and then washed with ethanol. As a result, a groove 15 shown in FIG. 5B was able to be formed.

Instead of the Si$^{++}$ ions of acceleration energy 200 keV, substantially the same results as in the third embodiment were obtained by irradiating 200-keV Be$^{++}$ ions or 200-keV Au$^{++}$ ions to the superconducting thin film and by treatment in a bromine solution. Likewise, other ions may also be used.

Supplementary Description

Figure 13:
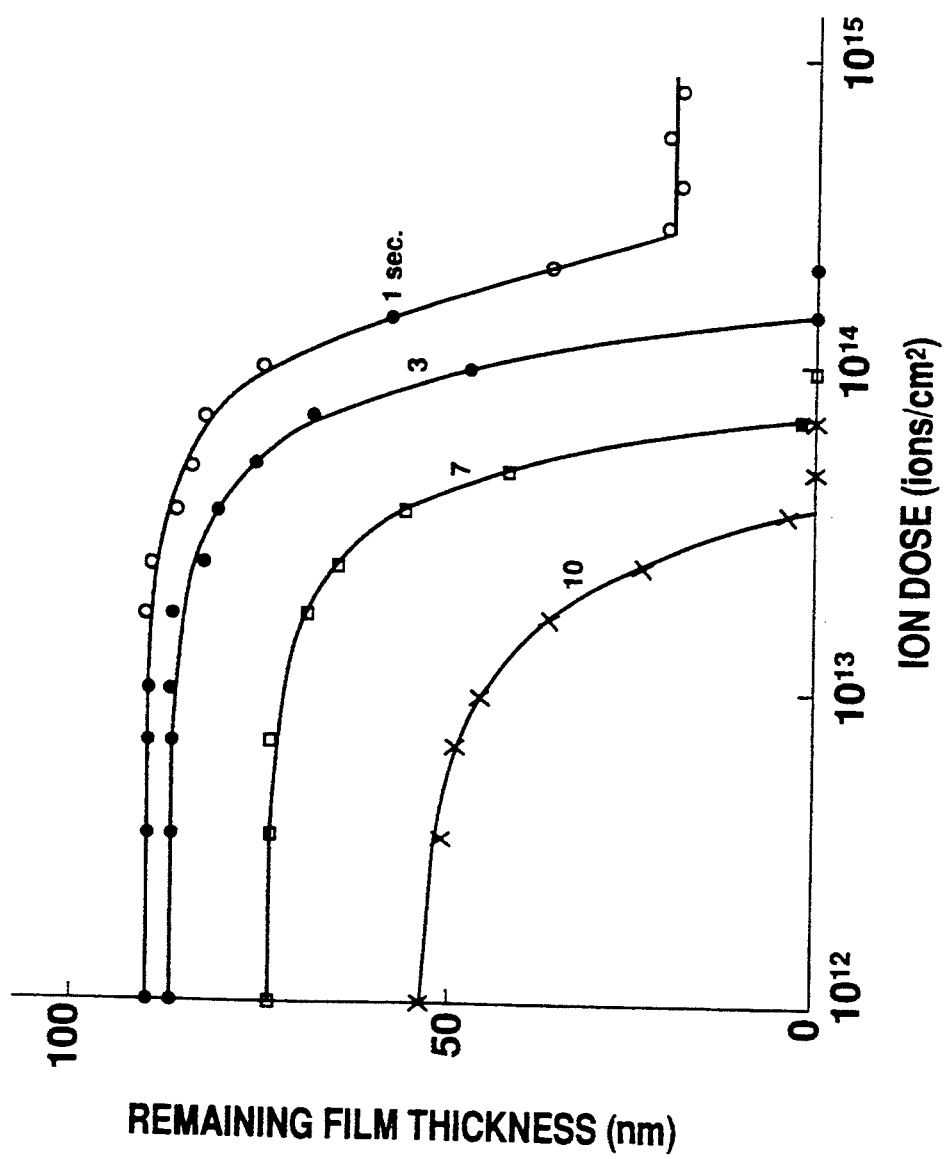
FIG. 13 is a graph showing the relationship between ion dose and remaining film thickness according to the processing method of the third embodiment of the invention.

FIG. 13 shows the results of experiments where the ion dose was variously changed in the first embodiment. 200-keV Si$^{++}$ was used for ions. The bromine ethanol solution concentration was 0.02 vol %, the treatment temperature was 20° C., and the treatment time was 1, 3, 7, and 10 seconds.

The 1-second treatment does not provide a remain film thickness which is zero, that is, the treatment is insufficient. The 3-second treatment provides a remaining film thickness which is zero in a portion irradiated at the dose of more than 1.4×10$^{14}$ ions/cm$^2$, and holds the reduction of the film thickness of the unexposed portion to 10 nm or less, that is, the treatment provides desired processing. The 7-second or 10-second treatment gives results similar to those of the 3-second treatment, but reduce the film thickness of the unexposed portion gradually, that is, the 7- or 10-second treatment is not totally adequate.

FIG. 13 reveals that the proper treatment time is about 3 seconds when the bromine ethanol solution concentration is 0.02 vol %.

The bromine solution treatment conditions are not limited to the above-mentioned values. For example, if the treatment time is prolonged when the concentration is decreased or if the treatment time is shortened when the concentration is increased, similar results are obtained. When the temperature is lowered, the treatment time should be prolonged; when the temperature is raised, the treatment time should be shortened.

Figure 14:
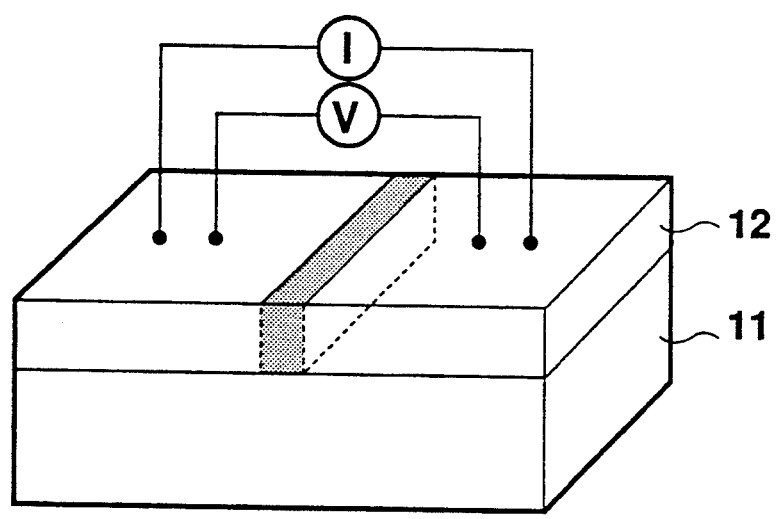
FIG. 14 is a schematic drawing of current-voltage characteristic measurement according to the third embodiment of the invention.

Next, evaluation of the electrical characteristics of superconducting thin films according to the embodiment is described. An experiment of the evaluation was made as shown in FIG. 14. After irradiation with ions, without bromine solution treatment, a voltage was applied to a superconducting thin film 12 on both sides of the ion irradiation portion for evaluation of the characteristics.

The ion dose of the "central broken line portion dividing the superconducting thin film" in FIG. 14 was changed to zero, 10$^{13}$, and 10$^{14}$ ions/cm$^2$ for measuring temperature dependency of resistance and the critical current density. The results are shown in FIG. 15.

The sample irradiated with 10$^{14}$ ions/cm$^2$ loses its superconducting characteristic. The resistivity at 60 K was about 2×10$^{-2}$ Ωcm. On the other hand, the sample irradiated with 10$^{13}$ ions/cm$^2$ provides substantially the same superconducting transition temperature as the sample irradiated with zero ions/cm$^2$, and also holds the critical current density at a slightly lower point.

Figure 15:
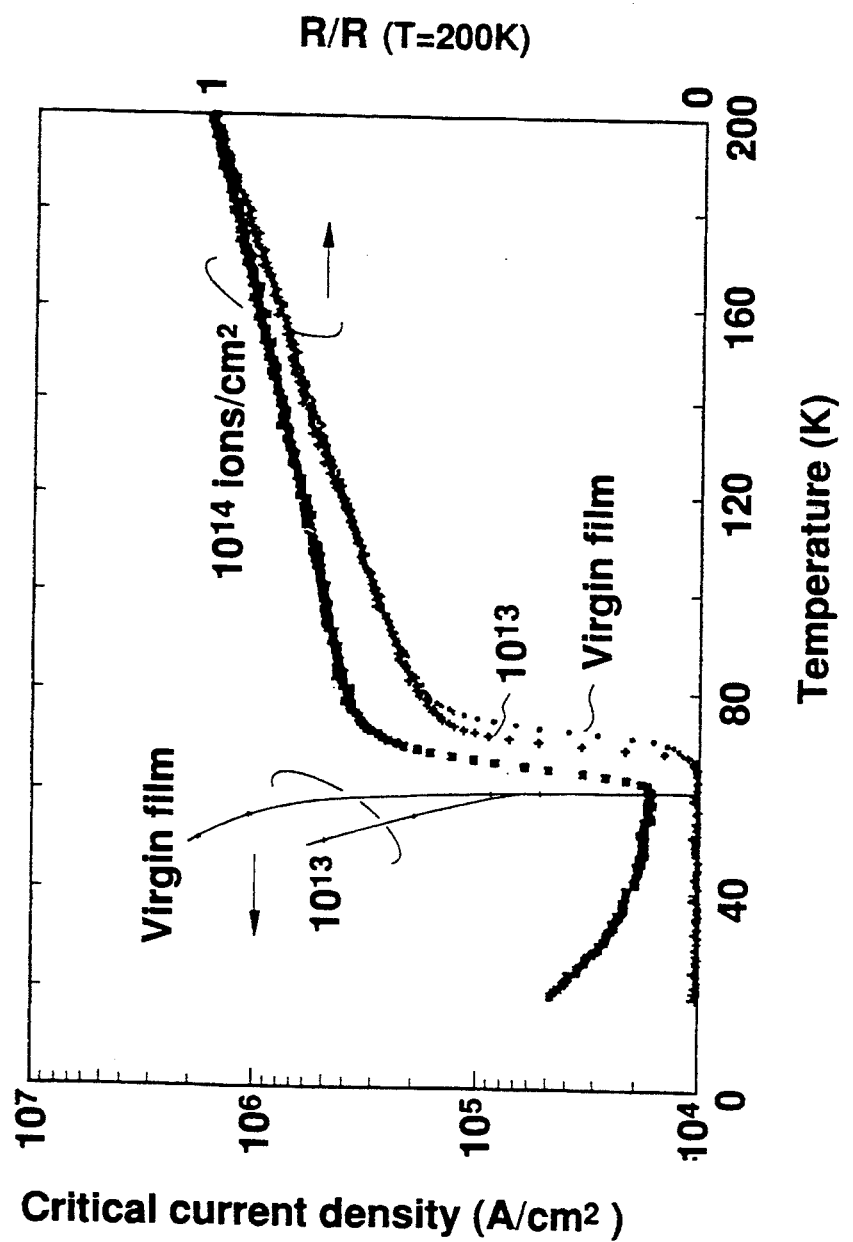
FIG. 15 is a graph showing temperature characteristics of a superconducting thin film according to the third embodiment of the invention.

FIG. 15 reveals that the superconducting thin film irradiated with 10$^{14}$ ions/cm$^2$ loses its superconducting characteristic and that the sample irradiated with 10$^{13}$ ions/cm$^2$ maintains its superconducting characteristic. That is, it was found that the ion dose used with the invention, 10$^{14}$ ions/cm$^2$, matches substantially the ion dose for losing the superconducting characteristic of a superconducting thin film. Therefore, the portion of the superconducting thin film which loses its superconducting characteristic is removed through the bromine solution. In contrast, the portion not removed by the bromine solution treatment is a portion in which the superconducting characteristic is maintained, that is, the superconducting thin film after the bromine solution treatment does not contain any damaged layer.

The portion irradiated with 10$^{14}$ ions/cm$^2$ loses its superconducting characteristic, but shows resistivity of about 2×10$^{-2}$ Ωcm at 60 K. and is not sufficiently divided. On the other hand, by the processing method according to the invention, a thin film is removed by bromine treatment and division is made at high resistivity of the removed portion, about 10$^5$ Ωcm. That is, superconducting thin films can be sufficiently divided by the processing method of the invention.

Substantially the same results as described above were obtained by making experiments with a bromine methanol solution, a bromine aqueous solution, a chlorine ethanol solution, a chlorine methanol solution, and a chlorine aqueous solution instead of a bromine ethanol solution.

Figure 16:
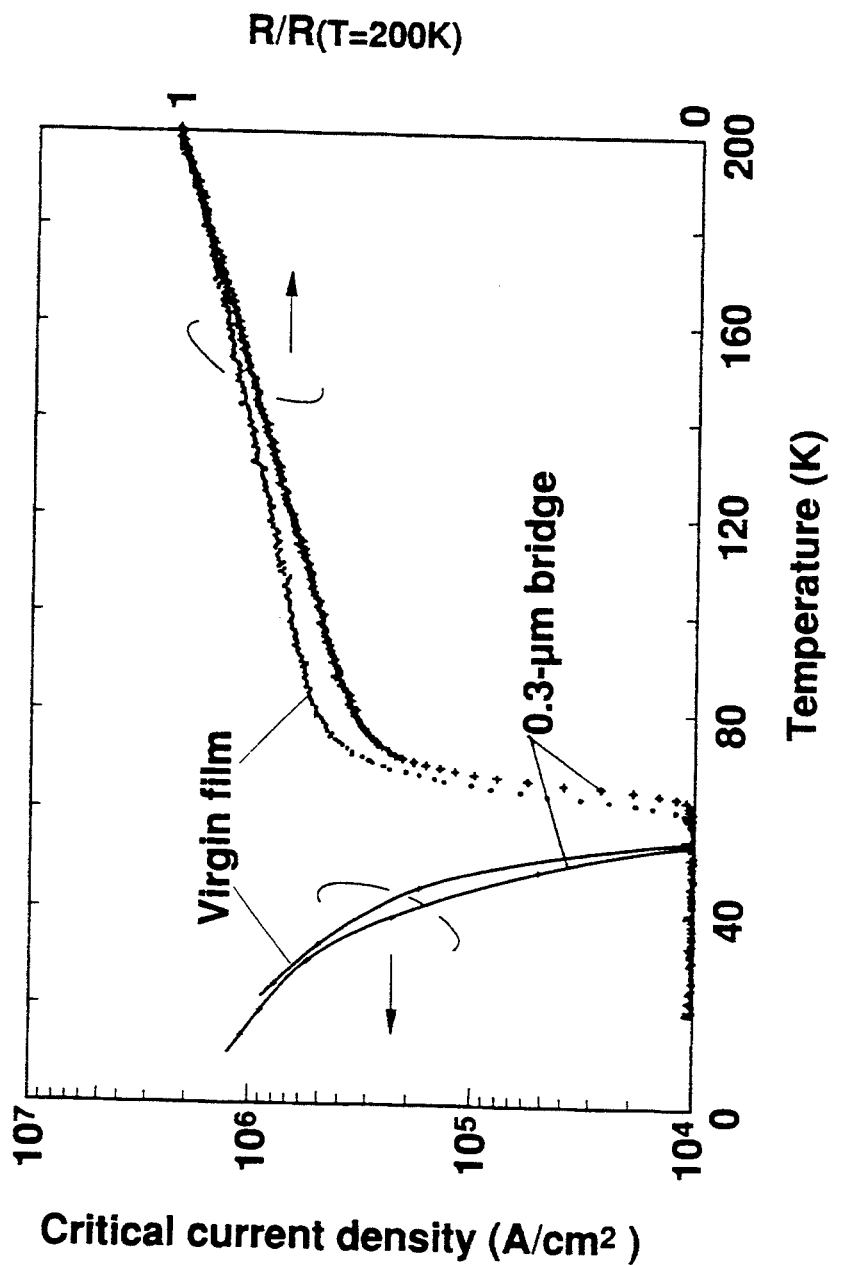
FIG. 16 is a graph showing temperature characteristics of a superconducting thin film according to the third embodiment of the invention.

Next, a measurement example of the electrical characteristics of a Y-Ba-Cu-O superconducting thin film processed by the method of the invention is given, as in FIG. 7 above. As shown in FIG. 16, a temperature dependency of resistance that was substantially the same as that before processing (that of virgin film) was also obtained when the remaining portion was 0.3 μm in width. Particularly, it is understood that the critical temperature at which superconducting occurs does not deteriorate very much. It is also understood that the critical current density is not very different from that before processing. It is understood that the electrical characteristics of a thin film scarcely deteriorate and that extremely fine processing can be applied by the invention.

In the embodiment, Bi-Sr-Ca-Cu-O system and Y-Ba-Cu-O system thin films were used as the superconducting thin films to be divided, but the embodiment can also be applied to Tl-Ba-Ca-Cu-O system thin films.

According to the invention, there is provided a method comprising the steps of irradiating an ion beam to a superconducting thin film to form a damaged layer or sputtering to form a groove and removing the damaged layer by using a bromine solution, thus unlike the conventional ion beam sputter etching method, the method of the invention does not leave damaged layers on both sides of a groove formed in a superconducting thin film and does not have the disadvantage that the effective superconducting gap is made wider than the apparent width of the groove due to a redeposit layer. Further, the method does not involve the four problems in the ion bombardment enhanced etching method using alkaline solution treatment. Therefore, a groove can be formed in a superconducting thin film with the effective gap width intact.

What is claimed is:

1. A method of processing a superconducting thin film formed on a substrate comprising the steps of:
    irradiating an ion beam to a superconducting thin film made of oxide superconducting material to form a damaged layer; and
    removing said damaged layer by using a halogen solution.

2. The method as claimed in claim 1 wherein said halogen solution is a bromine solution.

3. The method as claimed in claim 2 wherein said bromine solution is an ethanol solution of bromine.

4. The method as claimed in claim 1 wherein said superconducting thin film is a Bi-Sr-Ca-Cu-O superconducting thin film.

5. The method as claimed in claim 1 wherein said superconducting thin film is a Y-Ba-Cu-O superconducting thin film.

6. The method as claimed in claim 1 wherein said damaged layer forming step includes forming on said superconducting thin film a resist layer having a hole in a portion in which said damaged layer is to be formed and then irradiating ions to the entire resist layer.

7. The method as claimed in claim 6 wherein said halogen solution is a bromine solution.

8. The method as claimed in claim 7 wherein said bromine solution is an ethanol solution of bromine.

9. A method of processing a superconducting thin film formed on a substrate comprising the steps of:
    irradiating an ion beam to a superconducting thin film of oxide superconducting material for forming a groove in the thin film by sputtering and for forming a damaged layer in the thin film around said groove; and
    removing the damaged layer formed around said groove by using a halogen solution.

10. The method as claimed in claim 9 wherein said halogen solution is a bromine solution.

11. The method as claimed in claim 10 wherein said bromine solution is an ethanol solution of bromine.

12. The method as claimed in claim 9 wherein said superconducting thin film is a Bi-Sr-Ca-Cu-O superconducting thin film.

13. The method as claimed in claim 9 whrein said sputtering step includes forming on said superconducting thin film a resist layer having a hole in a portion in which said damaged layer is to be formed and then irradiating ions to the entire resist layer.

14. The method as claimed in claim 13 wherein said halogen solution is a bromine solution.

15. The method as claimed in claim 14 wherein said bromine solution is an ethanol solution of bromine.

* * * * *